US008122315B2

(12) United States Patent
Choi et al.

(10) Patent No.: US 8,122,315 B2
(45) Date of Patent: Feb. 21, 2012

(54) LDPC DECODING APPARATUS AND METHOD USING TYPE-CLASSIFIED INDEX

(75) Inventors: Eun-A Choi, Daejon (KR); Dae-Ig Chang, Daejon (KR); Deock-Gil Oh, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1249 days.

(21) Appl. No.: 11/607,592

(22) Filed: Nov. 30, 2006

(65) Prior Publication Data

US 2007/0150789 A1 Jun. 28, 2007

(30) Foreign Application Priority Data

Dec. 1, 2005 (KR) .................. 10-2005-0116053
Nov. 22, 2006 (KR) .................. 10-2006-0115857

(51) Int. Cl.
*H03M 13/00* (2006.01)
(52) U.S. Cl. .................. 714/758; 714/781
(58) Field of Classification Search .................. 714/758, 714/781
See application file for complete search history.

(56) References Cited

U.S. PATENT DOCUMENTS

| | | | | |
|---|---|---|---|---|
| 6,633,856 B2 * | 10/2003 | Richardson et al. | ............ | 706/15 |
| 6,829,308 B2 * | 12/2004 | Eroz et al. | .................. | 375/271 |
| 6,938,196 B2 * | 8/2005 | Richardson et al. | .......... | 714/752 |
| 6,957,375 B2 * | 10/2005 | Richardson | .................. | 714/752 |
| 6,961,888 B2 * | 11/2005 | Jin et al. | .................. | 714/752 |
| 6,963,622 B2 * | 11/2005 | Eroz et al. | .................. | 375/298 |
| 7,020,829 B2 * | 3/2006 | Eroz et al. | .................. | 714/794 |
| 7,133,853 B2 * | 11/2006 | Richardson et al. | ............ | 706/15 |
| 7,178,080 B2 * | 2/2007 | Hocevar | ..................... | 714/752 |
| 7,178,081 B2 * | 2/2007 | Lee et al. | .................... | 714/752 |
| 7,237,171 B2 * | 6/2007 | Richardson | .................. | 714/752 |
| 7,454,685 B2 * | 11/2008 | Kim et al. | .................... | 714/758 |
| 2004/0052144 A1 * | 3/2004 | Berens et al. | ................ | 365/221 |
| 2004/0153960 A1 | 8/2004 | Eroz et al. | | |
| 2005/0166133 A1 | 7/2005 | Eroz et al. | | |

FOREIGN PATENT DOCUMENTS

| | | |
|---|---|---|
| EP | 1601108 A1 | 2/2005 |
| JP | 2004-186940 | 7/2004 |
| KR | 10-2005-0004118 | 1/2005 |
| KR | 10-2005-0100152 | 10/2005 |
| KR | 10-2006-0068168 | 6/2006 |
| WO | WO 2004077680 A1 | 9/2004 |

OTHER PUBLICATIONS

Frederic Guilloud, Generic Architecture for LDPC Codes Decoding, Jul. 2004.*
Notice of Allowance issued by Korean Patent Office dated Dec. 20, 2007.

* cited by examiner

*Primary Examiner* — Joseph D Torres
(74) *Attorney, Agent, or Firm* — Sherr & Vaughn, PLLC

(57) ABSTRACT

Provided is a low-density parity-check (LDPC) decoding apparatus and method using a type-classified index. The apparatus includes: a memory allocating unit for multiplying reception data by an estimated channel value and storing a multiplied value in a memory including a plurality of memory block; an index storing unit for storing a Read Only Memory (ROM) index, an address index and a permutation index for the stored data; a check node updating unit for bring the stored data in parallel based on the ROM index, the address index, and the permutation index and updating a check node; and a bit node updating unit for updating a bit node based on the data stored in the memory and check node information updated in the check node updating unit.

6 Claims, 10 Drawing Sheets

FIG. 8A

Block 1:
| 2 | 13 | 26 | 64 | 80 |
| 16 | 27 | 34 | 72 | 76 |
| 0 | 9 | 28 | 34 | 55 |
| 7 | 27 | 29 | 33 | 62 |
| 11 | 18 | 28 | 30 | 69 |
| 9 | 10 | 29 | 31 | 33 |
| 8 | 23 | 31 | 32 | 32 |
| 11 | 25 | 33 | 42 | 84 |
| 5 | 7 | 15 | 34 | 56 |
| 0 | 19 | 32 | 35 | 43 |

Block 2:
| 6 | 12 | 21 | 38 | 57 |
| 7 | 12 | 31 | 61 | 70 |
| 8 | 12 | 35 | 65 | — |
| 1 | — | 9 | 29 | 34 |
| 3 | 10 | 18 | 23 | 33 |
| 11 | 13 | 17 | 47 | 72 |
| 7 | 12 | 15 | 24 | 81 |
| 9 | 13 | 30 | 34 | 49 |
| 6 | 14 | 31 | 32 | 43 |
| 15 | 22 | 26 | 79 | 84 |
| 1 | 13 | 16 | 20 | 32 |
| 2 | 17 | 17 | 24 | 28 |
| 2 | 18 | 34 | 39 | 53 |
| 18 | 19 | 27 | 35 | 62 |
| 9 | 9 | 20 | 22 | 75 |
| 21 | 22 | 23 | 69 | 77 |
| 14 | 22 | 26 | 29 | 54 |
| 7 | 23 | 24 | 28 | 36 |
| 13 | 15 | 24 | 41 | 44 |
| 2 | 22 | 25 | 48 | 82 |

Block 3:
| 15 | 20 | 70 | 75 | 76 |
| 17 | 31 | 57 | 58 | 77 |
| 16 | 20 | 27 | 78 | 86 |
| 14 | 21 | 59 | 79 | 89 |
| 8 | 19 | 25 | 39 | 80 |
| 1 | 5 | 18 | 22 | 81 |
| 7 | 21 | 33 | 71 | 82 |
| 0 | 26 | 50 | 65 | 83 |
| 0 | 10 | 14 | 35 | 84 |
| 0 | 5 | 29 | 33 | 85 |
| 1 | 11 | 12 | 60 | 86 |
| — | 3 | 21 | 85 | 87 |
| 5 | 17 | 73 | 87 | 88 |
| 10 | 23 | 40 | 68 | 89 |
| — | 3 | 6 | 8 | 83 |
| 1 | 25 | 30 | 53 | 88 |
| 2 | 6 | 28 | 30 | 42 |
| 3 | 3 | 12 | 26 | 60 |
| 4 | 4 | 23 | 29 | 35 |
| 5 | 17 | 29 | 44 | 54 |

Block 4:
| 11 | 19 | 31 | 56 | 74 |
| 0 | 11 | 57 | 67 | — |
| 19 | 8 | 31 | 71 | 85 |
| 3 | 31 | 58 | 45 | 59 |
| 4 | 9 | 19 | 52 | 60 |
| 19 | 17 | 35 | 61 | 78 |
| 2 | 24 | 27 | 62 | 83 |
| 7 | 29 | 52 | 63 | 66 |
| 18 | 13 | 34 | 45 | 64 |
| 5 | 25 | 32 | 35 | 65 |
| 20 | 6 | 14 | 66 | 86 |
| 3 | 22 | 47 | 67 | 80 |
| 6 | 4 | 46 | 64 | 68 |
| 15 | 17 | 25 | 40 | 69 |
| 11 | 16 | 35 | 77 | 88 |
| 14 | 12 | 70 | 36 | 71 |
| 5 | 22 | 28 | 51 | 72 |
| 4 | 21 | 25 | 61 | 73 |
| 7 | 10 | 31 | 50 | 74 |
| 20 | 26 | 37 | 55 | 75 |

Block 5:
| 26 | 27 | 30 | 36 | 74 |
| 10 | 10 | 20 | 37 | 41 |
| 4 | 16 | 27 | 38 | 51 |
| 2 | 6 | 16 | 39 | 68 |
| 9 | 24 | 33 | 40 | 82 |
| 3 | 13 | 24 | 30 | 41 |
| 14 | 21 | 32 | 42 | 76 |
| 4 | 28 | 34 | 43 | 89 |
| 16 | 18 | 30 | 44 | 87 |
| 21 | 24 | 45 | 58 | 79 |
| 1 | 4 | 5 | 37 | 46 |
| 8 | 19 | 20 | 32 | 47 |
| 15 | 26 | 33 | 48 | 78 |
| 8 | 16 | 46 | 49 | 66 |
| 0 | 18 | 50 | 63 | 67 |
| 13 | 23 | 30 | 51 | 63 |
| 6 | 11 | 52 | 59 | 73 |
| 8 | 27 | 49 | 53 | 56 |
| 14 | 23 | 25 | 54 | 81 |
| 2 | 15 | 28 | 38 | 55 |

FIG. 8B

| 4 | 2 | 6 | 0 | 1 |
| 2 | 7 | 7 | 0 | 1 |
| 4 | 1 | 5 | 0 | 2 |
| 2 | 4 | 5 | 0 | 1 |
| 4 | 1 | 6 | 0 | 2 |
| 6 | 2 | 3 | 1 | 0 |
| 5 | 2 | 3 | 0 | 2 |
| 2 | 4 | 5 | 0 | 1 |
| 3 | 1 | 5 | 0 | 0 |
| 4 | 7 | 0 | 2 | 1 |
| 3 | 6 | 2 | 5 | 0 |
| 2 | 3 | 1 | 5 | 2 |
| 1 | 7 | 4 | 0 | 2 |
| 5 | 4 | 2 | 0 | 1 |
| 6 | 4 | 4 | 0 | 2 |
| 6 | 4 | 2 | 0 | 1 |
| 5 | 7 | 4 | 0 | 2 |
| 6 | 4 | 1 | 0 | 2 |
| 4 | 2 | 6 | 0 | 1 |
| 4 | 2 | 5 | 1 | 0 |

| 1 | 4 | 5 | 0 | 2 |
| 3 | 1 | 6 | 0 | 2 |
| 6 | 6 | 3 | 0 | 1 |
| 3 | 3 | 2 | 7 | 1 |
| 5 | 5 | 1 | 4 | 2 |
| 2 | 2 | 4 | 6 | 0 |
| 3 | 3 | 6 | 1 | 1 |
| 6 | 6 | 4 | 4 | 1 |
| 5 | 5 | 3 | 2 | 1 |
| 3 | 3 | 6 | 3 | 2 |
| 6 | 6 | 4 | 6 | 0 |
| 4 | 4 | 7 | 2 | 1 |
| 7 | 7 | 2 | 5 | 1 |
| 6 | 6 | 4 | 6 | 2 |
| 4 | 4 | 7 | 5 | 1 |
| 7 | 7 | 6 | 0 | 2 |
| 7 | 7 | 5 | 2 | 0 |
| 7 | 7 | 1 | 6 | 0 |
| 7 | 7 | 5 | 1 | 2 |
| 5 | 5 | 3 | 1 | 0 |

| 5 | 3 | 1 | 2 | 0 |
| 3 | 7 | 2 | 1 | 0 |
| 2 | 4 | 7 | 0 | 1 |
| 6 | 3 | 1 | 0 | 2 |
| 7 | 5 | 1 | 2 | 0 |
| 2 | 4 | 2 | 1 | 0 |
| 4 | 7 | 5 | 2 | 0 |
| 1 | 1 | 6 | 2 | 0 |
| 5 | 5 | 2 | 3 | 0 |
| 4 | 4 | 1 | 2 | 0 |
| 7 | 7 | 6 | 2 | 0 |
| 5 | 5 | 7 | 1 | 0 |
| 3 | 3 | 5 | 2 | 0 |
| 0 | 0 | 2 | 6 | 1 |
| 0 | 0 | 3 | 4 | 2 |
| 0 | 0 | 7 | 1 | 1 |
| 0 | 0 | 1 | 3 | 2 |
| 0 | 0 | 5 | 7 | 1 |
| 0 | 0 | 3 | 2 | 2 |
| 0 | 0 | 5 | 1 | 1 |

| 0 | 3 | 7 | 2 | 1 |
| 0 | 5 | 4 | 1 | 2 |
| 0 | 2 | 7 | 5 | 1 |
| 1 | 5 | 0 | 4 | 2 |
| 0 | 7 | 6 | 2 | 1 |
| 7 | 0 | 4 | 5 | 2 |
| 0 | 4 | 7 | 4 | 2 |
| 1 | 0 | 4 | 2 | 1 |
| 3 | 0 | 4 | 6 | 2 |
| 0 | 6 | 1 | 0 | 4 |
| 6 | 0 | 4 | 4 | 1 |
| 0 | 3 | 3 | 0 | 2 |
| 3 | 6 | 3 | 1 | 7 |
| 3 | 0 | 7 | 3 | 2 |
| 0 | 7 | 3 | 2 | 1 |
| 3 | 0 | 1 | 5 | 2 |
| 0 | 3 | 0 | 2 | 6 |
| 0 | 5 | 2 | 1 | 1 |
| 5 | 7 | 0 | 2 | 1 |
| 7 | 6 | 0 | 2 | 1 |

| 5 | 3 | 0 | 2 | 1 |
| 6 | 0 | 3 | 2 | 1 |
| 2 | 7 | 0 | 6 | 1 |
| 2 | 3 | 0 | 7 | 1 |
| 2 | 6 | 3 | 0 | 1 |
| 5 | 4 | 1 | 0 | 2 |
| 3 | 6 | 1 | 0 | 2 |
| 3 | 7 | 0 | 1 | 2 |
| 2 | 5 | 3 | 0 | 1 |
| 4 | 1 | 6 | 0 | 2 |

FIG. 8C

| | | | | |
|---|---|---|---|---|
| 60 101 293 0 179 | 310 326 67 0 266 | 23 272 224 248 0 | 0 1 49 358 60 | 297 29 0 262 4 |
| 310 299 74 0 206 | 54 337 172 0 80 | 11 85 193 293 0 | 0 18 137 282 65 | 117 0 107 236 27 |
| 329 346 42 0 222 | 271 54 0 70 305 | 49 122 115 0 287 | 0 292 330 262 159 | 201 73 0 193 6 |
| 98 291 93 0 8 | 153 316 190 176 0 | 300 310 245 0 137 | 280 327 0 36 228 | 203 358 0 143 345 |
| 43 121 324 0 82 | 325 287 156 263 0 | 300 212 253 352 0 | 180 0 289 36 135 | 171 354 118 0 31 |
| 208 106 224 151 0 | 357 71 132 0 284 | 309 292 302 183 0 | 0 147 257 86 70 | 123 198 26 0 294 |
| 74 257 124 0 22 | 71 243 275 0 117 | 295 31 335 288 0 | 107 0 308 9 283 | 28 242 24 0 36 |
| 234 316 95 0 146 | 230 192 291 0 341 | 265 195 121 20 0 | 114 0 89 128 330 | 101 7 0 124 119 |
| 28 345 63 0 311 | 87 28 350 237 0 | 257 181 156 149 0 | 165 0 113 154 302 | 183 353 207 0 139 |
| 19 19 0 64 7 | 122 122 286 219 0 | 247 174 341 64 0 | 0 15 234 222 272 | 62 144 2 0 199 |
| 332 220 184 359 0 | 234 299 205 0 330 | 48 112 244 212 0 | 96 115 0 344 223 | |
| 83 160 227 190 0 | 232 34 175 0 127 | 320 296 117 131 0 | 86 0 196 76 298 | |
| 27 281 179 0 163 | 158 31 171 147 0 | 125 10 61 219 0 | 352 0 187 93 136 | |
| 260 215 45 0 129 | 249 273 67 314 0 | 114 215 223 163 0 | 176 0 30 282 144 | |
| 332 134 0 260 229 | 313 72 0 189 36 | 0 70 268 98 310 | 173 55 0 76 230 | |
| 194 25 176 0 61 | 131 208 187 83 0 | 0 13 355 195 354 | 0 143 8 257 346 | |
| 225 121 0 236 275 | 325 131 83 64 0 | 0 16 184 328 349 | 157 0 118 71 87 | |
| 187 306 239 0 58 | 216 75 291 164 0 | 0 189 254 52 254 | 235 0 104 108 199 | |
| 250 309 87 0 199 | 257 196 317 318 0 | 0 41 153 304 81 | 209 85 0 184 48 | |
| 168 221 200 246 0 | 259 28 3 265 | 0 255 248 271 186 | 259 117 0 161 350 | |

LDPC DECODING APPARATUS AND METHOD USING TYPE-CLASSIFIED INDEX

FIELD OF THE INVENTION

The present invention relates to a low-density parity-check (LDPC) decoding apparatus and method using a type-classified index; and, more particularly, to an LDPC decoding apparatus and method using a type-classified index which can efficiently perform LDPC decoding, at a high speed by forming a memory structure for parallel decoding, when the LDPC decoding apparatus using a structuralized parity check matrix, e.g., a parity check matrix adopted in a digital video broadcasting-satellite 2 (DVB-S2) standard, is realized, and performing memory control and management through the type-classified index such as a Read Only Memory (ROM) index, an address index and a permutation index.

DESCRIPTION OF RELATED ART

A communication/broadcasting system adopts a channel encoding/decoding method to secure data transmitted through a noise channel as a reliable data. An object of designing of the channel encoding/decoding method is achieving performance close to Shannon limit. A low-density parity-check (LDPC) code is one of codes known as a code which is the most close to the Shannon limit among channel code algorithms. The LDPC is not generally used due to difficulty in realization. It is because an LDPC coding technology is complicated.

A parity creation matrix is required to perform LDPC coding on information data. The parity creation matrix is differently formed according to a length of information data to be coded and a length of parity to be added. The parity creation matrix to be used in coding is very important to satisfy desired performance after decoding.

The LDPC code means a low-density parity check code as shown in a term of the LDPC code. The parity creation matrix requires a sparse matrix, which is important. However, since the number of '1' element increases in the sparse matrix according to the number of the parity bits added to coded data, memory management for storing the created matrix is also very important.

A formation of the parity creation matrix affects on improvement of a speed and performance in a decoding procedure as well as an encoding procedure. Also, Check Node Update (CNU) and Bit Node Update (BNU) procedures are determined by the formation of the parity creation matrix in the decoding procedure. Accordingly, an efficient memory managing and controlling method is necessarily required.

Meanwhile, most conventional LDPC decoders are manufactured for mobile communication. A short frame is processed in a mobile communication standard. Accordingly, although a node information update process including a bit node update process and a check node update process is performed in series, it is possible to provide to a speed suggested in the mobile communication standard. Also, processing the short frame does not cause a problem in a parallel process method. However, 64800 bits should be processed in a decoding procedure of the DVB-S2 standard. Accordingly, since adopting a serial process method as in the mobile communication decreases the update process speed, an efficient parallel process method is essentially required.

SUMMARY OF THE INVENTION

It is, therefore, an object of the present invention to provide a low-density parity-check (LDPC) decoding apparatus and method using a type-classified index which can efficiently perform LDPC decoding at a high speed by forming a memory structure for parallel decoding when the LDPC decoding apparatus using a structuralized parity check matrix, e.g., a parity check matrix adopted in a digital video broadcasting-satellite 2 (DVB-S2) standard, and performing memory control/management through the type-classified index such as a Read Only Memory (ROM) index, an address index and a permutation index.

Other objects and advantages of the invention will be understood by the following description and become more apparent from the embodiments in accordance with the present invention, which are set forth hereinafter. It will be also apparent that objects and advantages of the invention can be embodied easily by the means defined in claims and combinations thereof.

In accordance with an aspect of the present invention, there is provided a LDPC decoding apparatus using a structuralized parity check matrix, including: a memory allocating unit for multiplying reception data by an estimated channel value and storing a multiplied value in a memory including a plurality of memory block; an index storing unit for storing a ROM index, an address index and a permutation index for the stored data; a check node updating unit for bringing the stored data in parallel based on the ROM index, the address index, and the permutation index and updating a check node; and a bit node updating unit for updating a bit node based on the data stored in the memory and check node information updated in the check node updating unit.

In accordance with another aspect of the present invention, there is provided a LDPC decoding method using a structuralized parity check matrix, including the steps of: a) multiplying reception data by an estimated channel value and storing a multiplied value in a memory including a plurality of memory blocks; b) bring the stored data in parallel based on a ROM index, an address index, and a permutation index for the data and updating a check node; and c) updating a bit node based on the stored data and the updated check node information.

BRIEF DESCRIPTION OF THE DRAWINGS

The above and other objects and features of the present invention will become apparent from the following description of the preferred embodiments given in conjunction with the accompanying drawings, in which:

FIGS. 8A to 8C show an index used in the LDPC decoding procedure in accordance with an embodiment of the present invention.

DETAILED DESCRIPTION OF THE INVENTION

Other objects and advantages of the present invention will become apparent from the following description of the embodiments with reference to the accompanying drawings. Therefore, those skilled in the field of this art of the present invention can embody the technological concept and scope of the invention easily. In addition, if it is considered that detailed description on a related art may obscure the points of the present invention, the detailed description will not be provided herein. The preferred embodiments of the present invention will be described in detail hereinafter with reference to the attached drawings.

Figure 1:
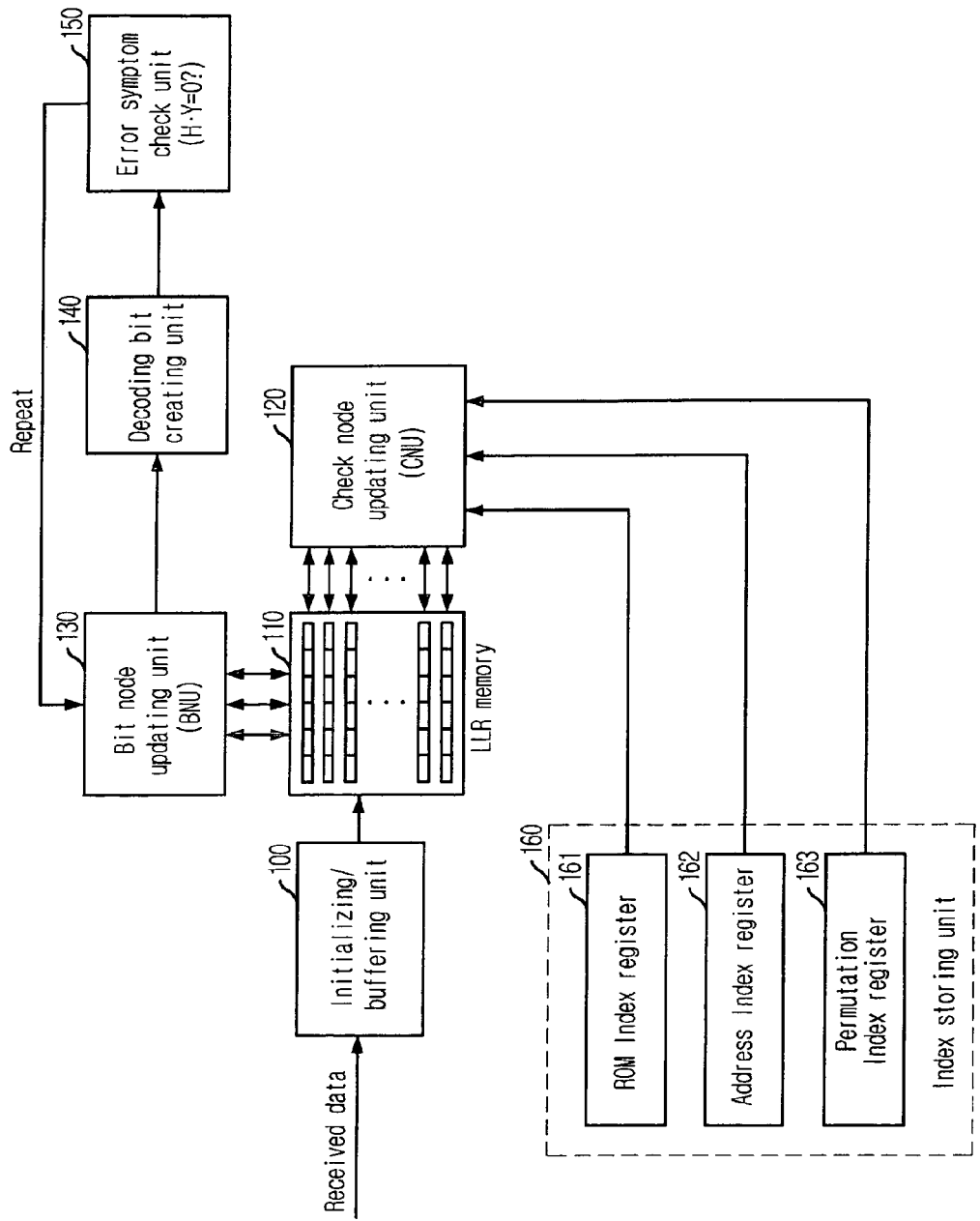
FIG. 1 is a block diagram showing a low-density parity-check (LDPC) decoding apparatus using a type-classified index in accordance with an embodiment of the present invention.

FIG. 1 is a block diagram showing a low-density parity-check (LDPC) decoding apparatus using a type-classified index in accordance with an embodiment of the present invention. FIG. 1 is based on LDPC decoding using a structuralized parity check matrix.

The LDPC decoding apparatus of the present invention includes an initializing/buffering unit 100, which is a memory allocating unit, a log-likelihood ratio (LLR) memory 110, a check node updating (CNU) unit 120, a bit node updating (BNU) unit 130, a decoding bit creating unit 140, an error symptom check unit 150, and an index storing unit 160. Each constitutional element will be described hereinafter.

The initializing/buffering unit 100 multiplies the received data by an estimated channel value and performs initial allocation on the estimated channel value, i.e., stores the estimated channel value in the LLR memory 110.

The LLR memory 110 is formed of a plurality of memory blocks. The memory blocks are arranged as a structure of a column address register, which is suggested in a digital video broadcasting-satellite (DVB-S2) standard. The values are stored in an order. One memory block includes 360 data symbols.

The check node updating unit 120 updates a check node based on information stored in the LLR memory 110 and index stored in the index storing unit 160 such as Read-Only Memory (ROM)/address/permutation index. That is, the check node updating unit 120 brings the data stored in the LLR memory 110 in parallel based on the ROM index, the address index, and the permutation index and updates the check node.

The bit node updating unit 130 updates a bit node based on the information stored in the LLR memory 110 and check node information updated in the check node updating unit 120.

The decoding bit creating unit 140 creates decoded data by output of the bit node updating unit 130. The error symptom check unit 150 determines whether check node update (CNU) and bit node update (BNU) are repeated by performing error check on the decoded data outputted in the decoding bit creating unit 140.

Figure 6:
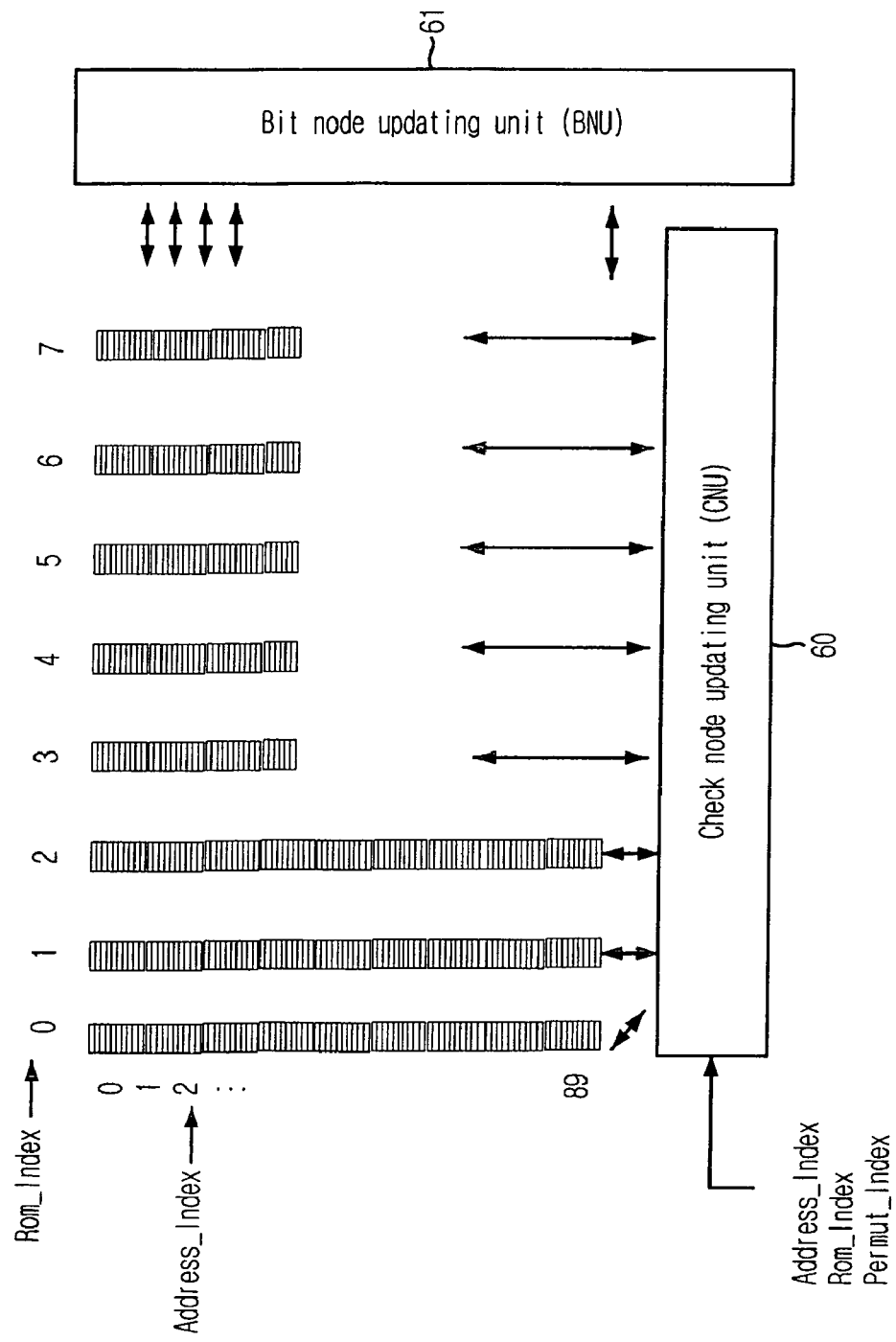
FIG. 6 shows index relationship in an LDPC decoding procedure in accordance with an embodiment of the present invention.

The index storing unit 160 stores Rom_Index, Address_Index, and Permut_Index of the data stored in the LLR memory 110 and stores each index in different registers 161, 162 and 163. The Rom_Index shows a column of the memory block in FIG. 6 showing the configuration of the memory. The Address_Index shows a row of the memory block among a specific ROM memory. The Permut_Index shows a location of the symbol in a corresponding block when a memory block is divided into 360 memory blocks.

The Rom_Index divides a memory to update the bit node in parallel. The Address_Index and the Permut_Index update the check node in parallel. The index is ruled as above to perform the update process in parallel.

The LDPC decoding method performed in the LDPC decoding apparatus of the present invention will be described. To realize the LDPC decoding method, it is required to form a memory structure for parallel decoding and use the type-classified index such as the Rom_Index, the Address_Index, and the Permut_Index to efficiently control/manage the memory.

The present invention multiplies a reception signal by an estimated channel value and allocates a multiplied result in the LLR memory 110. Also, the present invention updates the check node based on the information allocated in the LLR memory.

The present invention updates the bit node based on the information provided in a memory allocating procedure and a check node updating procedure. Also, the present invention controls repeated operations or stop of the check node updating procedure and the bit node updating procedure. The present invention outputs a decoding determination bit based on the information data acquired from the control procedure.

Figure 2:
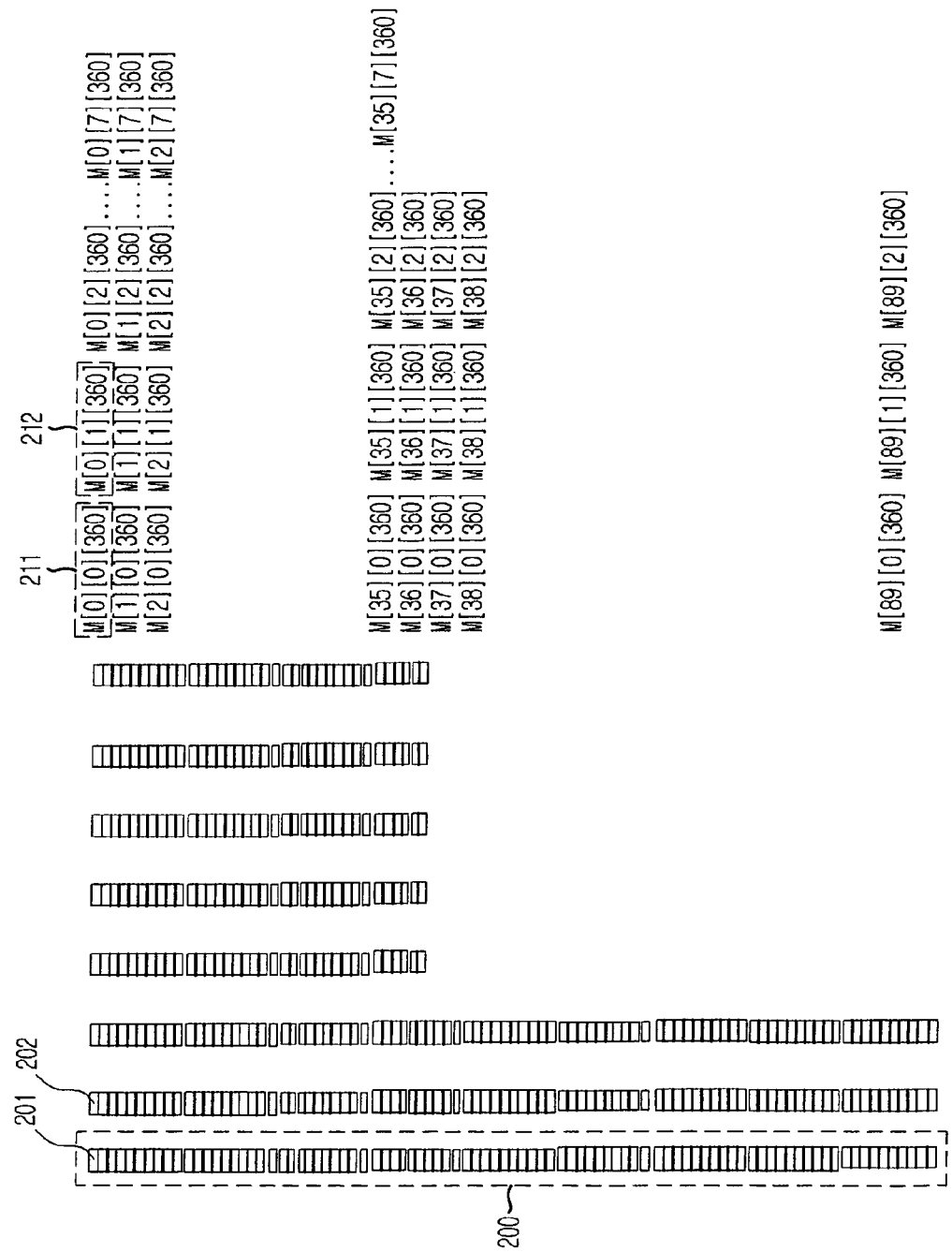
FIG. 2 shows a configuration of a log-likelihood ratio (LLR) memory of FIG. 1.

FIG. 2 shows a configuration of the LLR memory of FIG. 1.

The LLR memory 110 shows a memory structure of a information bit part at a code rate 1/2. A memory block 201 or a memory block 202 on a drawing is formed of 6-bits 360 symbols. An index displayed on a right lower part of FIG. 2 is a variable to be referred to when the node information is updated. That is, M[0][0][360] 211 is an index of the memory block 201 and M[0][1][360] 212 is an index of the memory block 202. Memory blocks in the same column are stored in the same memory as the memory 200.

Figure 3:
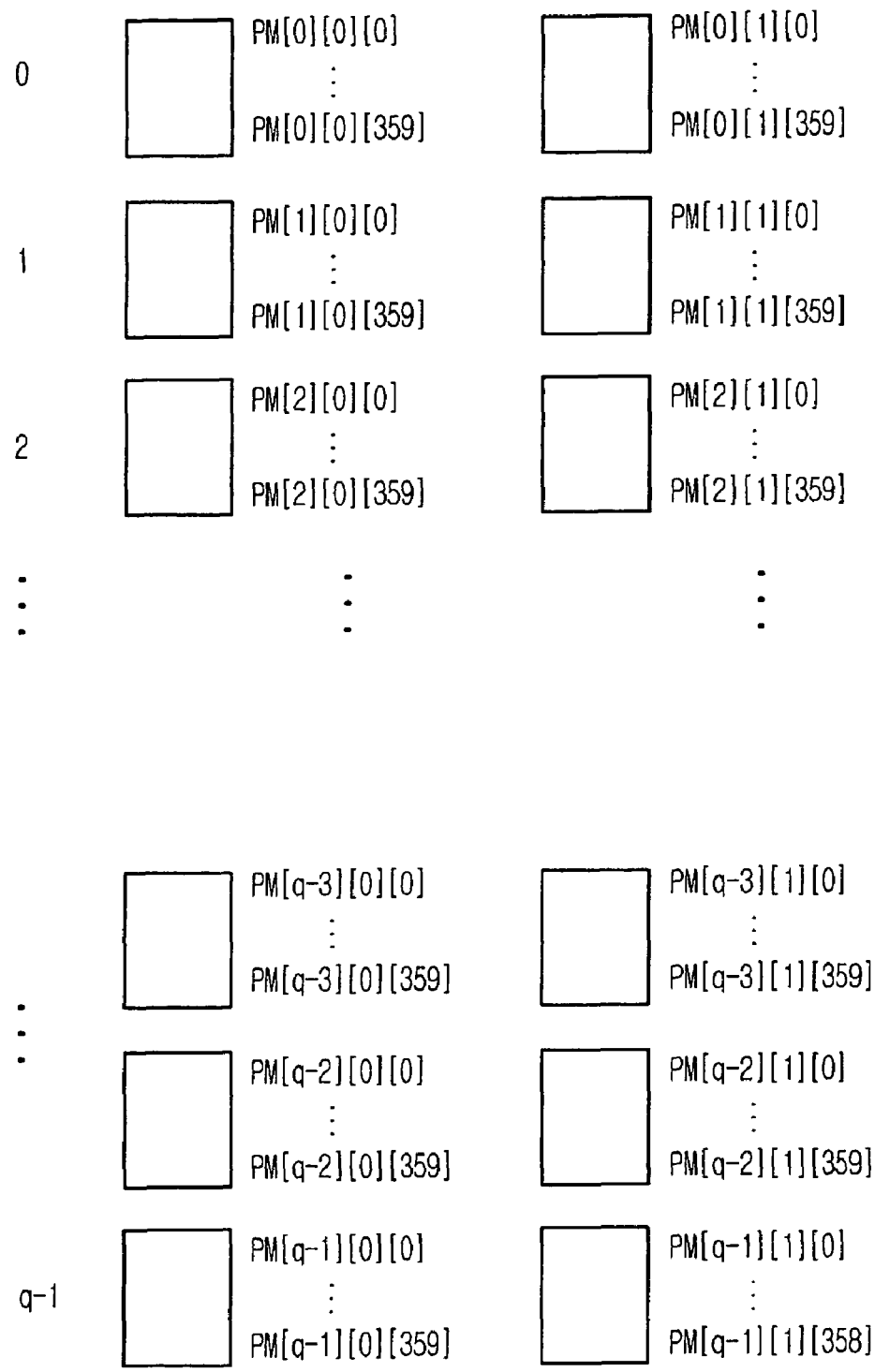
FIG. 3 illustrates a configuration of a memory block for a parity bit in the LLR memory of FIG. 2.

FIG. 3 illustrates a configuration of the memory block for a parity bit in the LLR memory of FIG. 2.

A memory for the parity bit has a structure for allocating information data while increasing the number of memories as many as the number of ROMs to efficiently calculate check node update.

At a code rate 1/2, 90 symbols increase every parity check matrix address and 360 data symbols are stored in a memory block.

Figure 5:
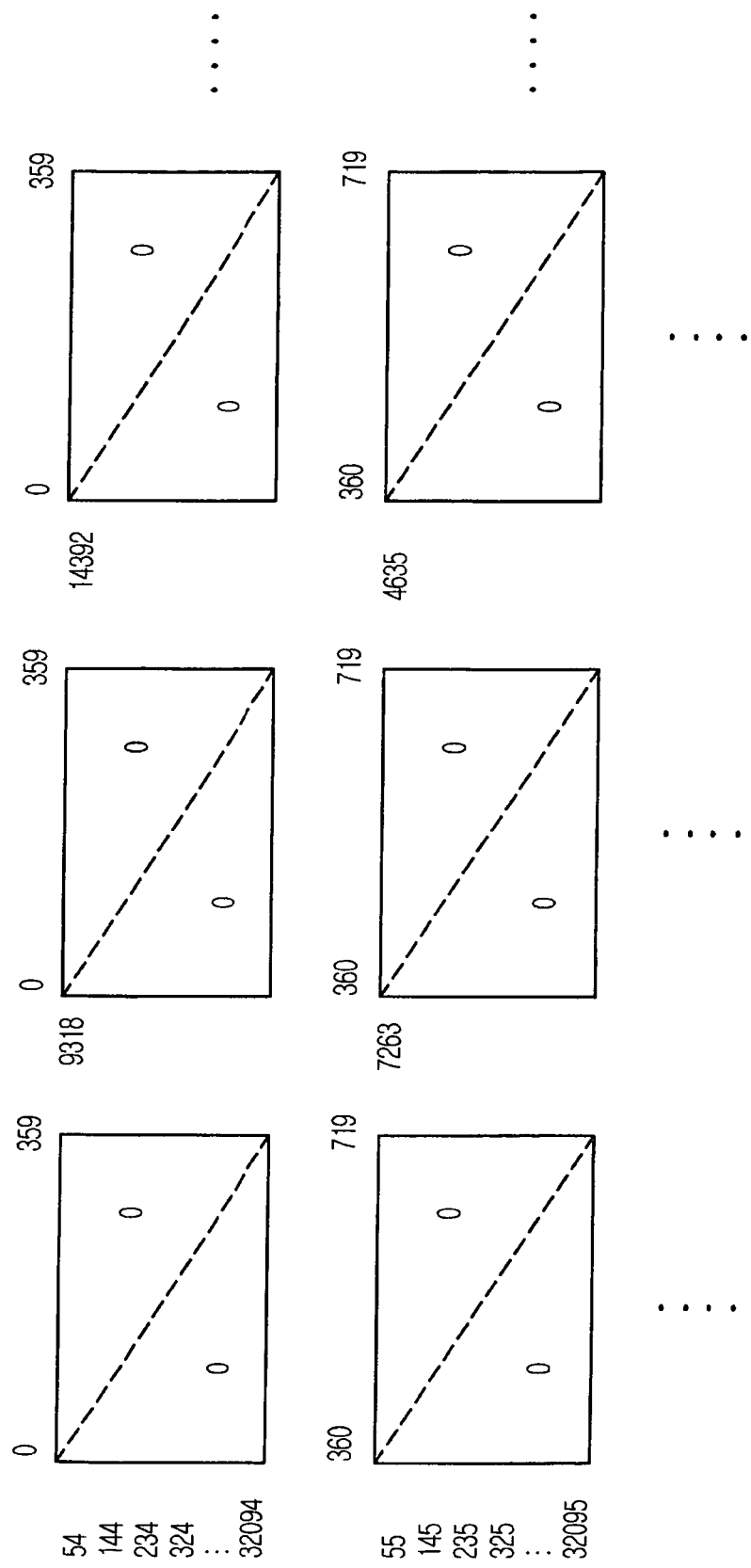
FIG. 5 illustrates a formation of the memory block for information bits in the LLR memory of FIG. 2 in accordance with an embodiment of the present invention.

When data are divided into data blocks every 360 symbols, a decoding procedure is performed as shown in FIG. 5.

A part parallel should have 360 check node update (CNU) processors and bit node update (BNU) processors and simultaneously calculate as many as the number of row weights.

When the check node update is completely calculated on a memory block having 360 data symbols, the check node update is calculated on a next memory block according to the same method. That is, the check node update is sequentially calculated on 90 memory blocks in serial. When the check node update is calculated, each memory block index and an index for a start location are required in each memory block. When the bit node update is calculated, only the memory block index is required since the start location is a start point of each memory block.

Figure 4:
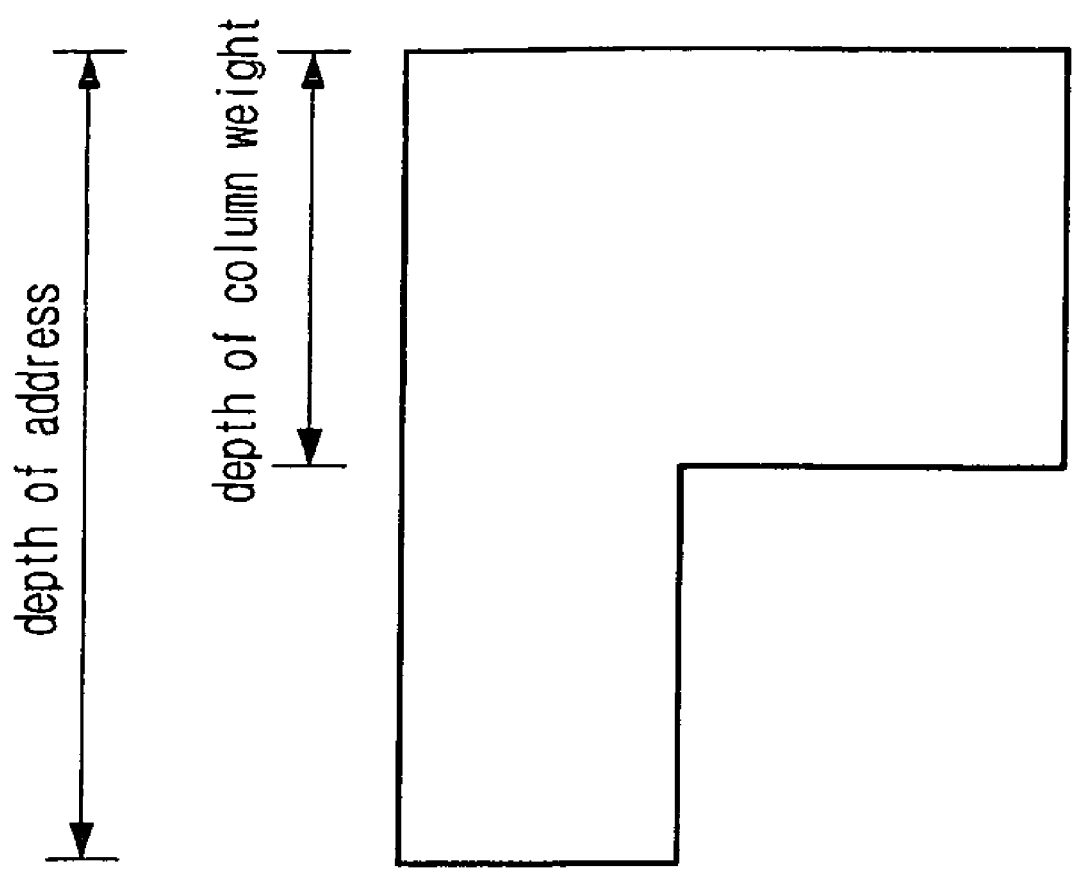
FIG. 4 shows an entire configuration of the LLR memory of FIG. 2.

FIG. 4 shows an entire configuration of the LLR memory of FIG. 2.

An entire structure of the LLR memory 110 of the present invention is arrange based on the same structure as the column address weight suggested in the DVB-S2 standard. Values are also sequentially stored.

FIG. 5 illustrates a configuration of the memory block for information bits in the LLR memory of FIG. 2 in accordance with an embodiment of the present invention.

As shown in the memory blocks 201 and 202 of FIG. 2, a memory block of the LLR memory 110 is formed of 360 data symbols and total 90 memory blocks are stored in each memory. A memory 200 of FIG. 2 includes 90 memory blocks.

FIG. 6 shows index relationship in an LDPC decoding procedure in accordance with an embodiment of the present invention.

The initializing/buffering unit 100 stores an initial value in the LLR memory 110. To be more specific, the initializing/buffering unit 100 multiplies an estimated channel value by reception data and stores multiplied values in each memory in parallel for each of 360 symbols.

The memory blocks in the same column are stored in the same memory. Total 8 memories are used as the same as the number of column weight.

When a memory is formed of 90 memory blocks and each memory block includes 360 symbols, a memory uses total 32,400 data symbols where each symbol is 6 bits. When it is assumed that 144 bits are stored in one address, 1,350 addresses are required.

A memory of a chip to be realized in the present invention can store 144 bits×4K data.

A check node updating unit 60 can access to 8 memories in parallel by accessing to each memory as many as 144 bits. A bit node updating unit 61 brings and calculates the memories in parallel with reference to an address in each memory.

Figure 7:
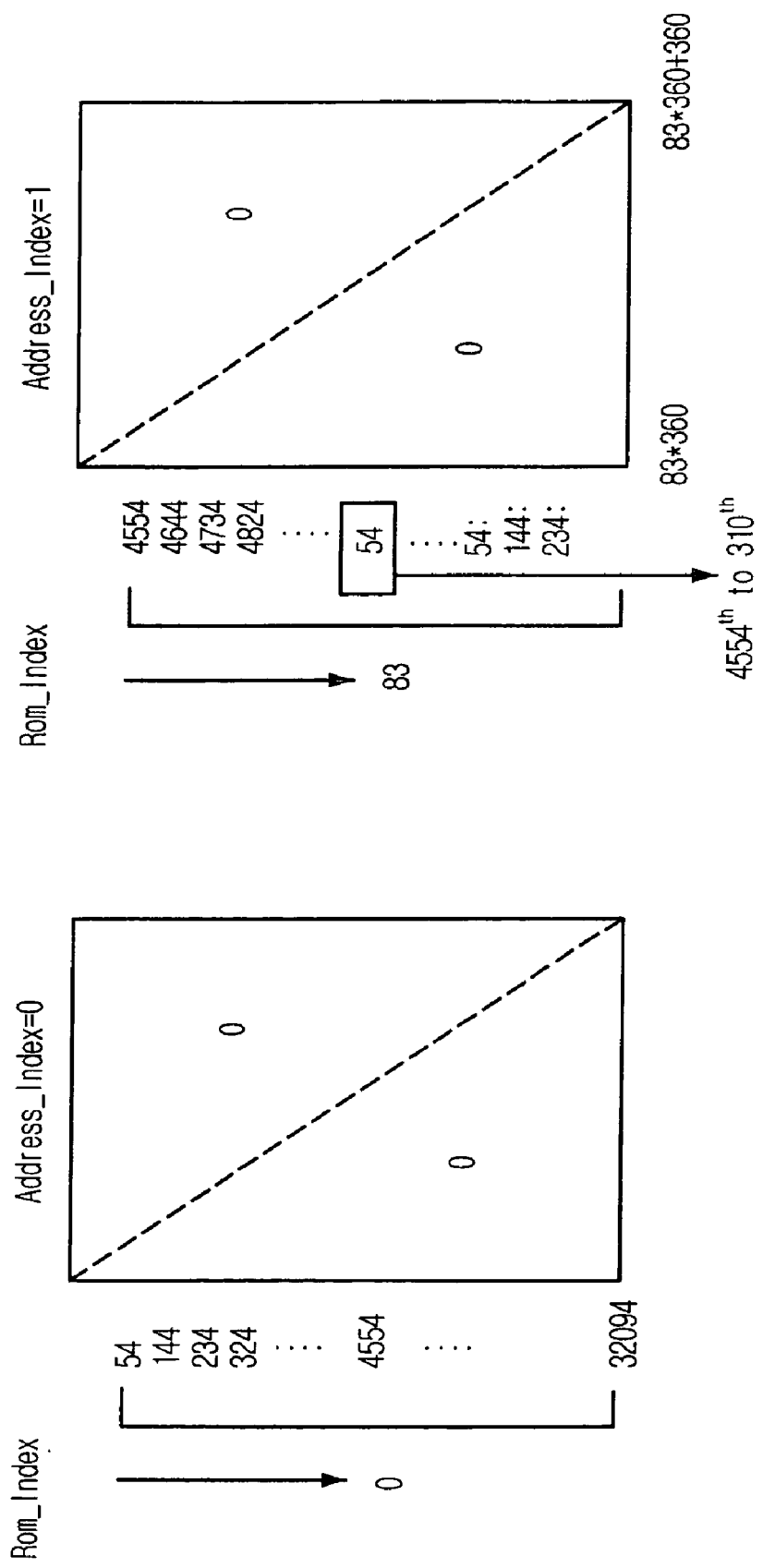
FIG. 7 shows a relationship between Rom_Index and Address_Index used in the LDPC decoding procedure in accordance with the embodiment of the present invention.

FIG. 7 shows a relationship between the Rom_Index and the Address_Index used in the LDPC decoding procedure in accordance with the embodiment of the present invention.

The Address_Index block is divided into 90 blocks and each memory block stores 360 data.

A block for $0^{th}$ Address_Index where Address index=0 stores 359 symbols from a $0^{th}$ symbol of the reception data. A second block where Address index=1 stores 360 symbols from a $360^{th}$ symbol. 90 memory blocks store total 32,400 reception data symbols where 90×360=32,400.

The initializing/buffering unit 100 can easily store the reception data by which the estimated channel value is multiplied based on the storing method as described above.

FIGS. 8A to 8C show the index used in the LDPC decoding procedure in accordance with an embodiment of the present invention.

FIG. 8A shows the Rom_Index and FIG. 8B shows the Address_Index. FIG. 8C shows the Permut_Index.

When the present invention realizes the LDPC decoding apparatus using a structuralized parity check matrix, e.g., a parity check matrix adopted in the DVB-S2 standard, the present invention forms the memory structure for parallel decoding and uses the type-classified index to control/manage the memory. Accordingly, the present invention can efficiently manage the memory, optimize the memory structure and perform the LDPC decoding at a high speed.

As described above, the technology of the present invention can be realized as a program and stored in a computer-readable recording medium, such as CD-ROM, RAM, ROM, floppy disk, hard disk and magneto-optical disk. Since the process can be easily implemented by those skilled in the art of the present invention, further description will not be provided herein.

The present application contains subject matter related to Korean patent application Nos. 2005-0116053 and 2006-0115857, filed with the Korean Intellectual Property Office on Dec. 1, 2005, and Nov. 22, 2006, respectively, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A low-density parity-check (LDPC) decoding apparatus using a structuralized parity check matrix, comprising:
    a memory allocating means for multiplying reception data by an estimated channel value and storing a multiplied value in a memory including a plurality of memory blocks;
    an index storing means for storing a Read Only Memory (ROM) index, an address index and a permutation index for the stored data;
    a check node updating means for bringing the stored data in parallel based on the ROM index, the address index, and the permutation index and updating a check node in parallel; and
    a bit node updating means for updating a bit node based on the data stored in the memory and check node information updated in the check node updating means,
    wherein:
    the number of memory blocks are increased as many as the number of ROMs in order to allocate information data;
    the multiplied value is stored in the memory blocks in an order;
    the check node updating means and the bit node updating means sequentially update the memory blocks when each of the memory blocks includes a plurality of data symbols; and
    the check node updating means and the bit node updating means simultaneously update as many as the number of row weights by part parallel according to the data symbols when the date symbols are divided into the data blocks.

2. The apparatus as recited in claim 1, wherein the ROM index shows a column of a memory block; the address index shows a row of the memory block in a corresponding memory; and the permutation index shows a location of symbol data in a corresponding memory block.

3. The apparatus as recited in claim 1, wherein the index storing means respectively stores and manages the ROM index, the address index and the permutation index.

4. The apparatus as recited in claim 1, wherein the memory has the same configuration as Column Address Register or Column Address Weight ruled in a Digital Video Broadcasting-Satellite 2 (DVB-S2) Standard.

5. The apparatus as recited in claim 1, wherein the check node updating means performs check node update based on an index for each memory block in the memory and an index for a start location in each memory block.

6. The apparatus as recited in claim 1, wherein the bit node updating means performs bit node update based on the index for each memory block in the memory.

* * * * *